US012787398B2

(12) United States Patent
Yeh et al.

(10) Patent No.: US 12,787,398 B2
(45) Date of Patent: Nov. 3, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Han Yeh, Hsinchu (TW); Yu-Lien Huang, Hsinchu (TW); Yuan-Sheng Huang, Taichung (TW); Yung-Cheng Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 396 days.

(21) Appl. No.: 18/601,278

(22) Filed: Mar. 11, 2024

(65) Prior Publication Data

US 2025/0285870 A1 Sep. 11, 2025

(51) Int. Cl.

| | |
|---|---|
| ***H01L 21/02*** | (2006.01) |
| ***H10D 30/01*** | (2025.01) |
| ***H10D 64/01*** | (2025.01) |
| ***H10P 14/60*** | (2026.01) |
| ***H10P 14/694*** | (2026.01) |
| ***H10W 20/00*** | (2026.01) |

(52) U.S. Cl.

CPC ..... *H10D 64/01354* (2026.01); *H10D 30/024* (2025.01); *H10P 14/6339* (2026.01); *H10P 14/6514* (2026.01); *H10P 14/69433* (2026.01); *H10W 20/083* (2026.01)

(58) Field of Classification Search

CPC ................. H10D 30/024; H10D 30/62; H10D 64/01354; H10P 14/6336; H10P 14/6339; H10P 14/6514; H10P 14/6529; H10P 14/6532; H10P 14/6682; H10P 14/6905; H10P 14/69433; H10W 20/077; H10W 20/083

See application file for complete search history.

(56) References Cited

U.S. PATENT DOCUMENTS

| | | | | |
|---|---|---|---|---|
| 11,581,218 | B2 * | 2/2023 | Hsiung .............. | H10D 30/6211 |
| 2020/0381306 | A1 * | 12/2020 | Park ...................... | H10D 30/024 |
| 2022/0320081 | A1 * | 10/2022 | Huang ................... | H10D 64/01 |

FOREIGN PATENT DOCUMENTS

| | | |
|---|---|---|
| TW | 202401586 A | 1/2024 |

* cited by examiner

*Primary Examiner* — Jaehwan Oh

(74) *Attorney, Agent, or Firm* — Ingrassia Fisher & Lorenz, LLP | IF&L

(57) ABSTRACT

A fabrication method includes: forming a gate structure between an interlayer dielectric (ILD) layer on a substrate; forming a metal cap layer over the gate structure; treating a substrate surface in an inductively coupled plasma (ICP) chamber, the treating comprising oxidation of a surface of the metal cap layer and reducing oxygen (O) content in a top surface of the ILD layer; performing inhibition operations in a furnace to prevent SiN from growing on the ILD layer; performing an anneal treatment on the substrate in the furnace; and selectively growing a SiN dielectric cap over the gate structure in the furnace.

20 Claims, 13 Drawing Sheets

940

942 944 946 948

| | NSD-SiN | NSD-SiN + PIX trt | Normal NSD-SiN |
|---|---|---|---|
| C% | 3.7 | 4.1 | 0.1 |
| Cl% | 1.3 | 1.2 | 0 |
| F% | 0.4 | 0.2 | 0 |
| N% | 30.5 | 36.2 | 55.9 |
| O% | 34.8 | 28.2 | 0.3 |
| Si% | 29.3 | 30.1 | 43.7 |
| W% | <0.1 | <0.1 | 0 |

FIG. 9E

SEMICONDUCTOR DEVICE AND MANUFACTURING METHOD THEREOF

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum feature sizes are reduced, additional problems arise that should be addressed.

BRIEF DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9E is a table illustrating example concentrations of various elements in a dielectric gate cap formed above a MG, in accordance with some embodiments.

DETAILED DESCRIPTION

Figure 1B:
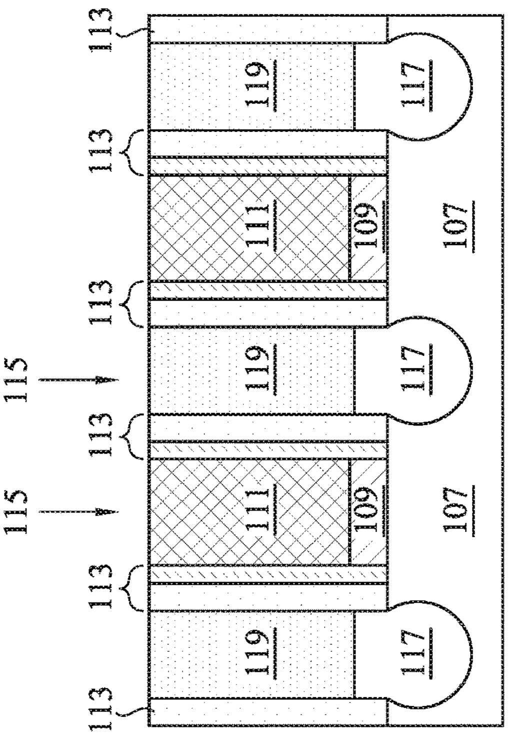
FIG. 1B illustrates a cross-sectional view of FIG. 1A along cutline X-X', in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as “over”, “overlying”, “above”, “upper”, “top”, “under”, “underlying”, “below”, “lower”, “bottom”, and the like, may be used herein for ease of description to describe one element’s or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being “on” another element or layer, it is directly on and in contact with the other element or layer.

In addition, the present disclosure may repeat reference numerals and/or letters in the various examples. This repetition is for the purpose of simplicity and clarity and does not in itself dictate a relationship between the various embodiments and/or configurations discussed.

It is noted that references in the specification to “one embodiment,” “an embodiment,” “an example embodiment,” “exemplary,” “example,” etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to affect such feature, structure, or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Various embodiments are discussed herein in a particular context, namely, for forming a semiconductor structure that includes a fin-like field-effect transistor (FinFET) device. The semiconductor structure, for example, may be a complementary metal-oxide-semiconductor (CMOS) device including a P-type metal-oxide-semiconductor (PMOS) FinFET device and an N-type metal-oxide-semiconductor (NMOS) FinFET device. Embodiments will now be described with respect to particular examples including FinFET manufacturing processes. Embodiments, however, are not limited to the examples provided herein, and the ideas may be implemented in a wide array of embodiments. Thus, various embodiments may be applied to other semiconductor devices/processes, such as planar transistors, and the like. Further, some embodiments discussed herein are discussed in the context of devices formed using a gate-last process. In other embodiments, a gate-first process may be used.

While the figures illustrate various embodiments of a semiconductor device, additional features may be added in the semiconductor device depicted in the Figures and some of the features described below can be replaced, modified, or eliminated in other embodiments of the semiconductor device.

Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1A:
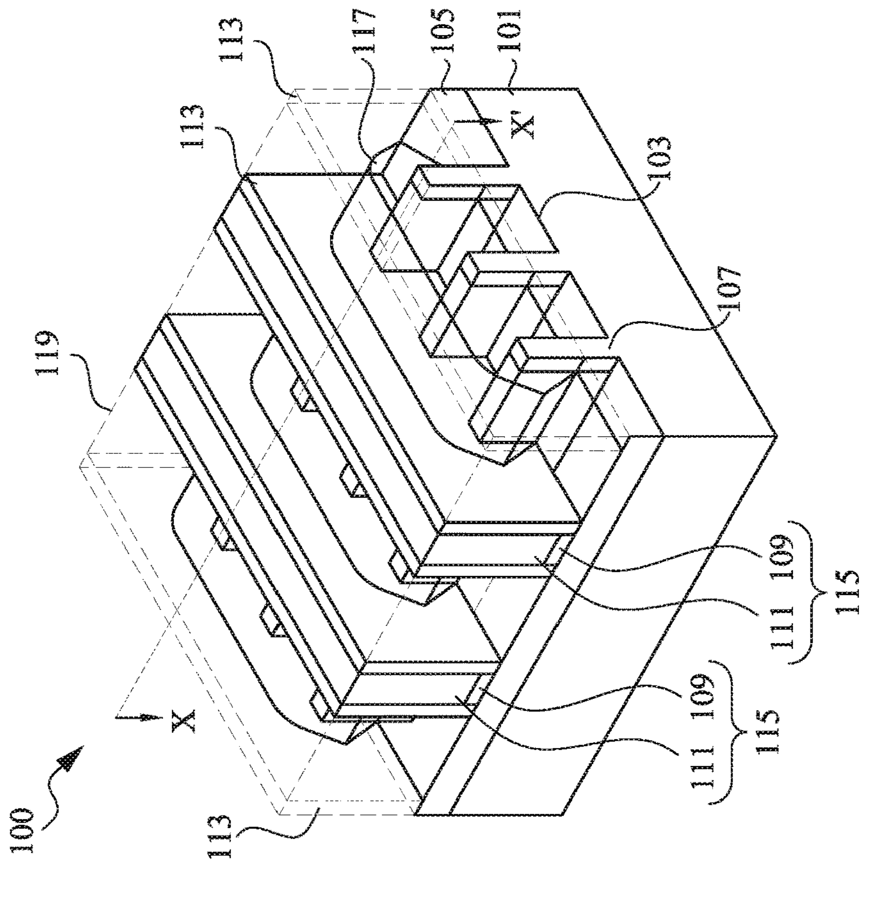
FIG. 1A a perspective view of a semiconductor device, in accordance with some embodiments.

With reference now to FIG. 1A, there is illustrated a perspective view of a semiconductor device 100 such as a FinFET device. FIG. 1B illustrates a cross-sectional view of FIG. 1A along cutline X-X', according to some embodiments. In an embodiment the semiconductor device 100 comprises a substrate 101 and first trenches 103. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

In other embodiments the substrate 101 may be chosen to be a material which will specifically boost the performance (e.g., boost the carrier mobility) of the devices formed from the substrate 101. For example, in some embodiments the material of the substrate 101 may be chosen to be a layer of epitaxially grown semiconductor material, such as epitaxially grown silicon germanium which helps to boost some of the measurements of performance of devices formed from the epitaxially grown silicon germanium. However, while the use of these materials may be able to boost some of the performance characteristics of the devices, the use of these same materials may affect other performance characteristics of the device. For example, the use of epitaxially grown silicon germanium may degrade (with respect to silicon) the interfacial defects of the device.

The first trenches 103 may be formed as an initial step in the eventual formation of first isolation regions 105. The first trenches 103 may be formed using a masking layer (not separately illustrated in FIG. 1A) along with a suitable etching process. For example, the masking layer may be a hard mask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching processes additionally form fins 107 from those portions of the substrate 101 that remain unremoved. These fins 107 may be used to form the channel region of multiple-gate FinFET transistors. While FIG. 1A only illustrates three of the fins 107 formed from the substrate 101, any number of fins 107 may be utilized.

Furthermore, the fins 107 may be patterned by any suitable method. For example, the fins 107 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 107.

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, dummy gate dielectrics 109, dummy gate electrodes 111 over the dummy gate dielectrics 109, and spacers 113 may be formed over each of the fins 107. In an embodiment the dummy gate dielectrics 109 may be formed by thermal oxidation, chemical vapor deposition, sputtering, or any other methods known and used in the art for forming a gate dielectric. Depending on the technique of gate dielectric formation, the dummy gate dielectrics 109 thickness on the top of the fins 107 may be different from the gate dielectric thickness on the sidewall of the fins 107.

The dummy gate dielectrics 109 may comprise a material such as silicon dioxide or silicon oxynitride. The dummy gate dielectrics 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof. Additionally, any combination of silicon dioxide, silicon oxynitride, and/or high-k materials may also be used for the dummy gate dielectrics 109.

The dummy gate electrodes 111 may comprise a conductive or non-conductive material and may be selected from a group comprising polysilicon, W, Al, Cu, AlCu, W, Ti, TiAlN, TaC, TaCN, TaSiN, Mn, Zr, TiN, Ta, TaN, Co, Ni, combinations of these, or the like. The dummy gate electrodes 111 may be deposited by chemical vapor deposition (CVD), sputter deposition, or other techniques known and used in the art for depositing conductive materials. The top surface of the dummy gate electrodes 111 may have a non-planar top surface, and may be planarized prior to patterning of the dummy gate electrodes 111 or gate etch. Ions may or may not be introduced into the dummy gate electrodes 111 at this point. Ions may be introduced, for example, by ion implantation techniques.

Once formed, the dummy gate dielectrics 109 and the dummy gate electrodes 111 may be patterned to form a series of dummy stacks 115 over the fins 107. The dummy stacks 115 define multiple channel regions located on each side of the fins 107 beneath the dummy gate dielectrics 109. The dummy stacks 115 may be formed by depositing and patterning a gate mask (not separately illustrated in FIG. 1A) on the dummy gate electrodes 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride. The dummy gate electrodes 111 and the dummy gate dielectrics 109 may be etched using a dry etching process to form the patterned in the dummy stacks 115.

Once the dummy stacks 115 have been patterned, the spacers 113 may be formed. The spacers 113 may be formed on opposing sides of the dummy stacks 115. The spacers 113 may be formed by blanket depositing one (as illustrated in FIG. 1A for clarity) or more (as illustrated in FIG. 1B) spacer layers on the previously formed structure. The one or more spacer layers may comprise SiN, oxynitride, SiC, SiON, SiOCN, SiOC, oxide, and the like and may be formed by methods utilized to form such layers, such as chemical vapor deposition (CVD), plasma enhanced CVD, sputter, and other methods known in the art. In embodiments with more than one spacer layer, the one or more spacer layers may be formed in similar manners using similar materials, but different from one another, such as by comprising materials having different component percentages and with different curing temperatures and porosities. Furthermore, the one or more spacer layers may comprise a different material with different etch characteristics or the same material as the dielectric material within the first isolation regions 105. The one or more spacer layers may then be patterned, such as by one or more etches to remove the one or more spacer layers from the horizontal surfaces of the structure. As such, the one or more spacer layers are formed along sidewalls of the dummy stacks 115 and are collectively referred to as the spacers 113.

FIG. 1A further illustrates a removal of the fins 107 (although the location of the fins 107 is still illustrated in FIG. 1A to show where they were originally located) from those areas not protected by the dummy stacks 115 and the spacers 113 and a regrowth of source/drain regions 117. Source/drain region(s) may refer to a source or a drain, individually or collectively dependent upon the context. The removal of the fins 107 from those areas not protected by the dummy stacks 115 and the spacers 113 may be performed by a reactive ion etch (RIE) using the dummy stacks 115 and the spacers 113 as hard masks, or by any other suitable removal process. The removal may be continued until the fins 107 are either planar with (as illustrated) or below the surface of the first isolation regions 105.

Once these portions of the fins 107 have been removed, a hard mask (not separately illustrated), is placed and patterned to cover the dummy gate electrodes 111 to prevent growth and the source/drain regions 117 may be regrown in contact with each of the fins 107. In an embodiment the source/drain regions 117 may be regrown and, in some embodiments the source/drain regions 117 may be regrown to form a stressor that will impart a stress to the channel regions of the fins 107 located underneath the dummy stacks 115. In an embodiment wherein the fins 107 comprise silicon and the FinFET is a p-type device, the source/drain regions 117 may be regrown through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes, such as about 30 minutes.

Once the source/drain regions 117 are formed, dopants may be implanted into the source/drain regions 117 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the dummy stacks 115 and the spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present embodiments to the steps presented above.

Additionally, at this point the hard mask that covered the dummy gate electrodes 111 during the formation of the source/drain regions 117 is removed. In an embodiment the hard mask may be removed using, e.g., a wet or dry etching process that is selective to the material of the hard mask. However, any suitable removal process may be utilized.

FIG. 1A also illustrates a formation of an interlayer dielectric (ILD) layer 119 (illustrated in dashed lines in FIG. 1A to illustrate more clearly the underlying structures) over the dummy stacks 115 and the source/drain regions 117. The ILD layer 119 may comprise a material such as boron phosphorous silicate glass (BPSG), although any suitable dielectrics may be used. The first ILD layer 119 may be formed using a process such as PECVD, although other processes, such as LPCVD, may alternatively be used. Once formed, the ILD layer 119 may be planarized with the spacers 113 using, e.g., a planarization process such as chemical mechanical polishing process, although any suitable process may be utilized.

Figure 2:
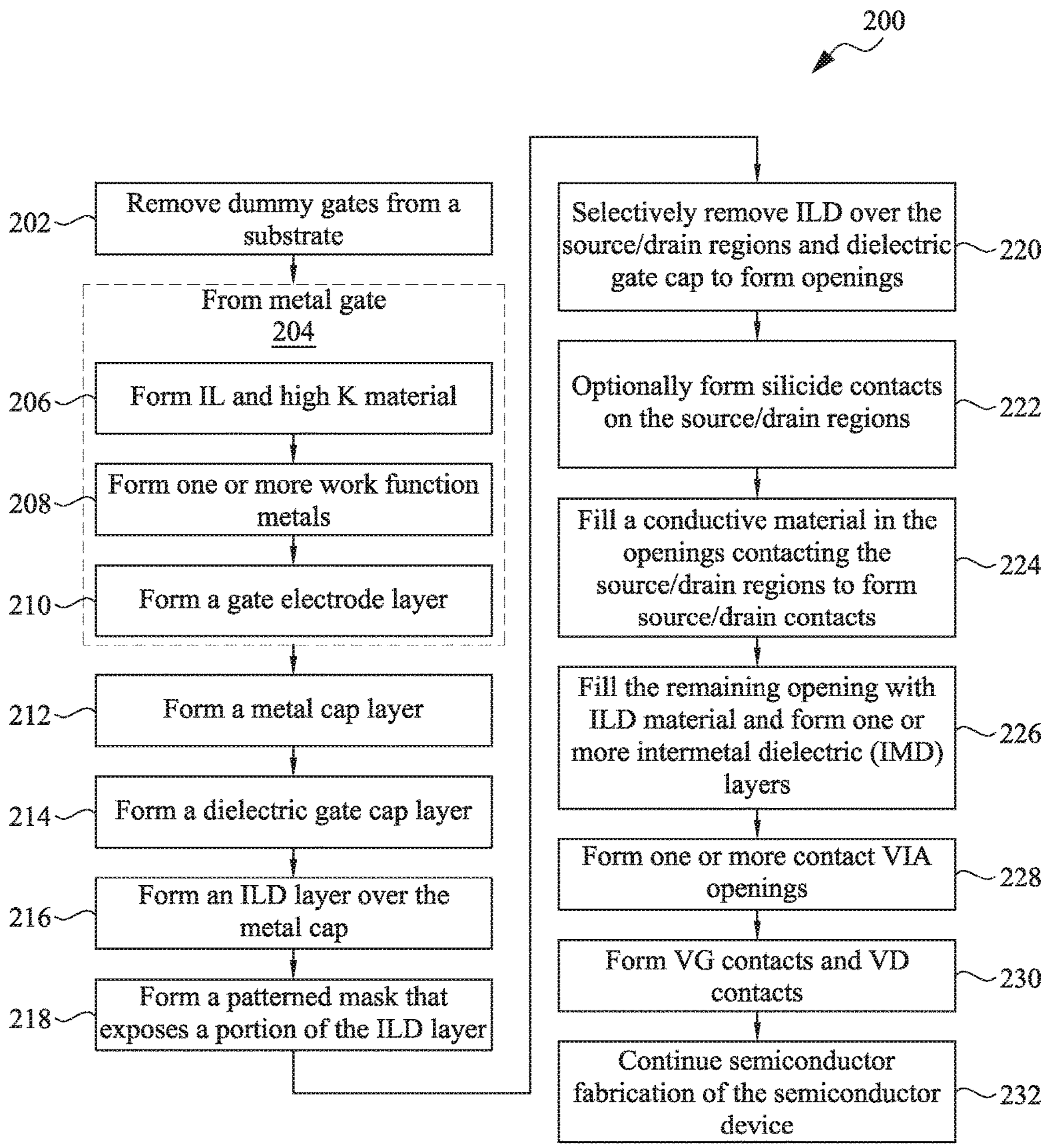
FIG. 2 is a process flow chart depicting an example process for forming FETs in a semiconductor device, in accordance with some embodiments.

FIG. 2 is a process flow chart depicting an example process 200 for forming FETs in a semiconductor device. FIG. 2 is described in conjunction with FIGS. 3A-3H, which are cross-sectional views of a semiconductor device, which illustrate the semiconductor device at various stages of fabrication in accordance with some embodiments of the present disclosure of the example process 200. The process 200 is merely an example, and is not intended to limit the present disclosure beyond what is explicitly recited in the claims. Additional steps may be provided before, during, and after example process 200, and some of the steps described can be moved, replaced, or eliminated for additional embodiments of example process 200. Additional features may be added in the semiconductor device depicted in the figures and some of the features described below can be replaced, modified, or eliminated in other embodiments of the semiconductor device.

It is understood that parts of the semiconductor device may be fabricated by typical semiconductor technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, and/or other logic devices, etc., but is simplified for a better understanding of concepts of the present disclosure. In some embodiments, the exemplary devices include a plurality of semiconductor devices (e.g., transistors), including PFETs, NFETs, etc., which may be interconnected. Moreover, it is noted that the operations of process 200, including any descriptions given with reference to the Figures are merely exemplary and are not intended to be limiting beyond what is specifically recited in the claims that follow.

FIGS. 3A-3G are diagrams depicting enlarged views of an example semiconductor structure 300 at various stages of fabricating a semiconductor device, in accordance with some embodiments. In some figures, some reference numbers of components or features illustrated therein may be omitted to avoid obscuring other components or features; this is for ease of depicting the figures.

At block 202, the example process 200 includes removing at least one dummy gate from a substrate. The dummy gate electrode and/or gate dielectric may be removed by suitable etching processes. Referring to the example of FIG. 3A, in an embodiment of block 202, the example semiconductor structure 300 includes a substrate 302 with openings 304 formed by the removal of dummy gates. In some embodiments, the substrate 302 may be a semiconductor substrate such as a silicon substrate. The substrate 302 may include various layers, including conductive or insulating layers formed on a semiconductor substrate. The substrate 302 may include various doping configurations depending on design requirements as is known in the art. For example, different doping profiles (e.g., n wells, p wells) may be formed on the substrate 302 in regions designed for different device types (e.g., n-type field effect transistors (NFET), p-type field effect transistors (PFET)). The suitable doping may include ion implantation of dopants and/or diffusion processes. The substrate 302 typically has isolation features (e.g., shallow trench isolation (STI) features) interposing the regions providing different device types. The substrate 302 may also include other semiconductors such as germanium, silicon carbide (SiC), silicon germanium (SiGe), or diamond. Alternatively, the substrate 302 may include a compound semiconductor and/or an alloy semiconductor. Further, the substrate 302 may optionally include an epitaxial layer (epi-layer), may be strained for performance enhancement, may include a silicon-on-insulator (SOI) structure, and/or have other suitable enhancement features.

The semiconductor structure further includes one or more spacer layers 306. In this example the one or more spacer layers 306 include a first spacer layer 306*a* (such as an etch stop layer) and a second spacer layer 306*b*. The one or more spacer layers may comprise $SiO_2$, SiN, SiOC, oxynitride, SiC, SiON, SiOCN, oxide, and the like and may be formed by methods utilized to form such layers, such as chemical vapor deposition (CVD), plasma enhanced CVD, sputter, and other methods known in the art.

The semiconductor structure further includes an interlayer dielectric (ILD0 layer 308) over source/drain regions 310. The ILD0 layer 308 may comprise an oxide or a material such as boron phosphorous silicate glass (BPSG), although any suitable dielectrics may be used. The ILD0 layer 308 may be formed using a process such as PECVD, although other processes, such as LPCVD, may alternatively be used.

At block 204, the example process 200 includes forming a metal gate in the opening, formed by the removal of the dummy gate, over the substrate. Referring to the example of FIG. 3B, in an embodiment of block 204, the example semiconductor structure includes a metal gate (MG 312) formed in the openings 304 (shown in FIG. 3A) over the substrate 302.

In various embodiments, forming a MG involves, at block 206, forming an interfacial layer (IL) in the openings 304 over the substrate 302 and a high-K material dielectric layer over the IL. The interfacial layer may be formed by chemical oxidation, thermal oxidation, atomic layer deposition (ALD), chemical vapor deposition (CVD), and/or other suitable material. In some embodiments, the interfacial layer may include a dielectric material such as silicon oxide ($SiO_2$), HfSiO, or silicon oxynitride (SiON).

The high-K dielectric layer may be formed by ALD, physical vapor deposition (PVD), CVD, oxidation, and/or other suitable methods. High-K gate dielectrics, as used and described herein, include dielectric materials having a high dielectric constant, for example, greater than that of thermal silicon oxide (~3.9). The high-K material dielectric layer may include a high-K dielectric layer such as hafnium oxide ($HfO_2$). Alternatively, the High-K gate dielectric layer may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba, Sr) $TiO_3$ (BST), $Al_2O_3$, $Si_3N_4$, oxynitrides (SiON), combinations thereof, or other suitable material.

In various embodiments, forming a MG may also involve, at block 208, forming one or more work function metal layers over the high-K gate dielectric layer. The one or more work function metal layers may be formed by CVD, ALD and/or other suitable processes. In some embodiments, the one or more work function metal layers may include one or more first work function metal layers comprising a p-type work function metal used for tuning the threshold voltage for p-type transistors and one or more second work function metal layers comprising an n-type work function metal used for tuning the threshold voltage for n-type transistors. The first work function metal layer may include a transition metal, such as TiN, TaN, WCN, or any suitable materials or a combination thereof. The second work function metal layer may include a transition metal, such as TiAlC, TaAlC, or any suitable materials or a combination thereof.

In various embodiments, forming a MG may also involve, at block 210, forming a gate electrode layer. The gate electrode layer may comprise a material such as TiN or any suitable materials or a combination thereof. The gate electrode layer may be formed by CVD, ALD and/or other suitable processes.

At block 212, the example process 200 includes forming a metal cap layer over the MG. The metal cap layer may comprise a metal such as Tungsten (W) or any suitable materials or a combination thereof. The metal cap layer may be formed by CVD, ALD and/or other suitable processes. Referring to the example of FIG. 3C, in an embodiment of block 212, the example semiconductor structure includes a metal cap layer 314 deposited over the MG 312.

At block 214, the example process 200 includes forming a dielectric gate cap layer over the metal cap layer. The dielectric gate cap layer may be formed by selective deposition of a dielectric, such as SiN over the metal cap layer, but not the surrounding ILD0 layer. The dielectric gate cap layer can function to protect the MG during subsequent metal drain (MD) formation. The dielectric gate cap layer is formed using a self-navigate deposition (SND) process described more fully below with reference to FIGS. 5 and 6. Use of the SND process to form the dielectric gate cap layer over the metal cap layer can allow semiconductor fabrication with a smaller MG height and smaller dielectric gate cap height than what may be needed if a different deposition process were used to form a dielectric gate cap layer over the metal cap layer. The SND process is a type of area-selective deposition process wherein deposition occurs at selected areas. Referring to the example of FIG. 3D, in an embodiment of block 214, the example semiconductor structure includes a dielectric gate cap layer 316 deposited over the metal cap layer 314, which in turn is formed over the MG 312. The dielectric gate cap layer 316, however, is not formed over the ILD0 layer 308.

At block 216, the example process 200 includes forming a second ILD layer (ILD1 layer) over the ILD0 layer and the dielectric gate cap layer. Referring to the example of FIG. 3E, in an embodiment of block 216, the example semiconductor structure includes an ILD1 layer 318 formed over the ILD0 layer 308 and the dielectric gate cap layer 316. The ILD1 layer 318 may include or be a material such as silicon nitride (SiN), although other suitable materials, such as silicon oxide ($SiO_2$), aluminum oxide (AlO), silicon oxycarbide (SiOC), silicon carbon (SiC), zirconium nitride (ZrN), zirconium oxide (ZrO), combinations of these, or the like, may also be utilized. The ILD1 layer 318 may be deposited using a deposition process such as plasma enhanced atomic layer deposition (PEALD), thermal atomic layer deposition (thermal ALD), plasma enhanced chemical vapor deposition (PECVD), or others. Any suitable deposition process and process conditions may be utilized.

Figure 3A:
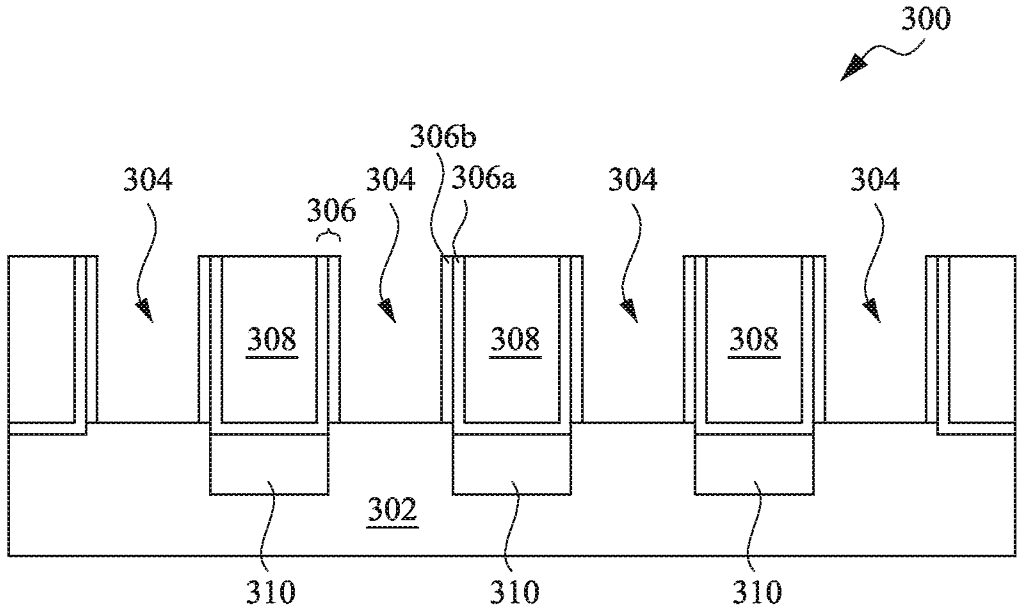
FIGS. 3A-3H, are cross-sectional views of a semiconductor device, which illustrate the semiconductor device at various stages of fabrication, in accordance with some embodiments.
Figure 3B:
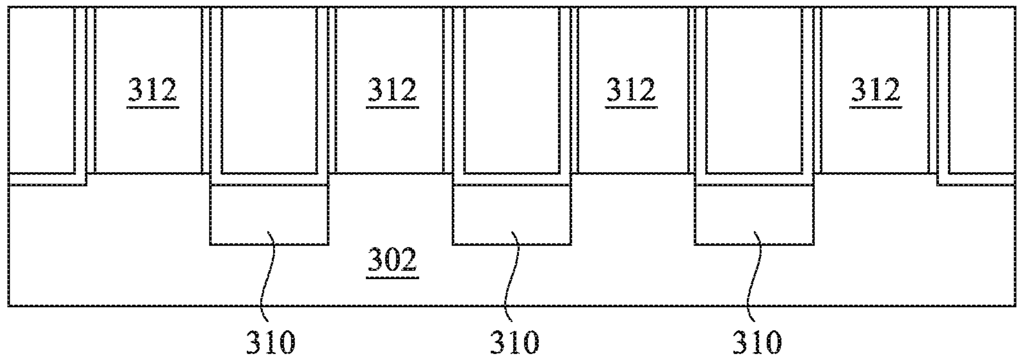
Figure 3C:
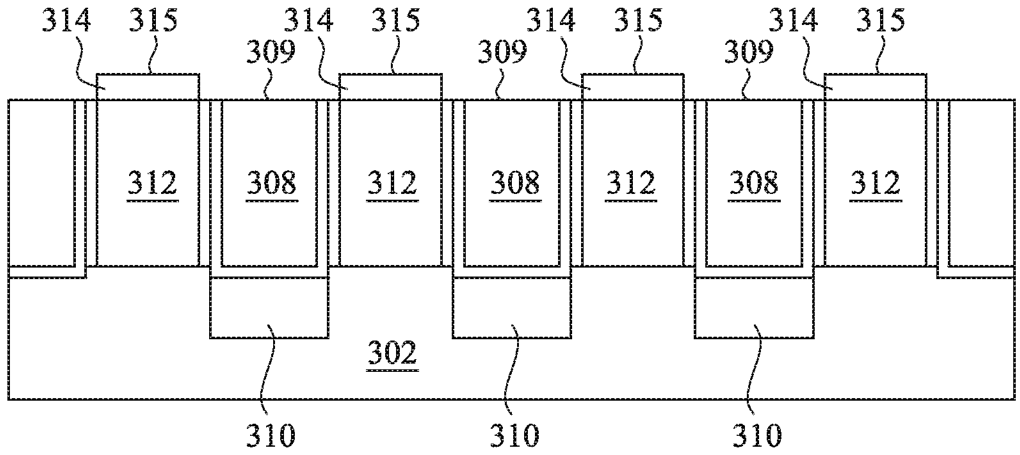
Figure 3D:
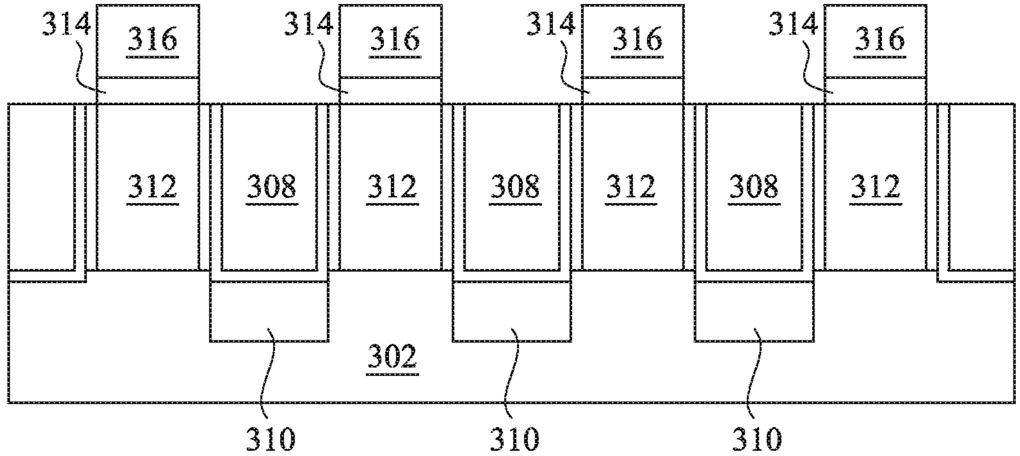
Figure 3E:
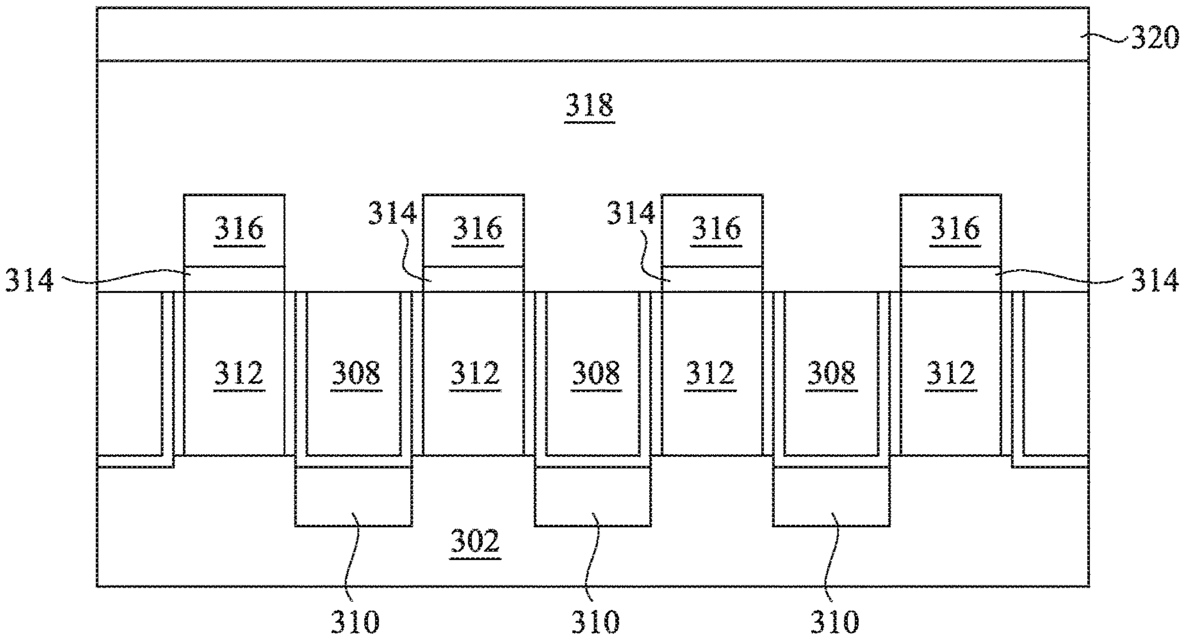
Figure 3F:
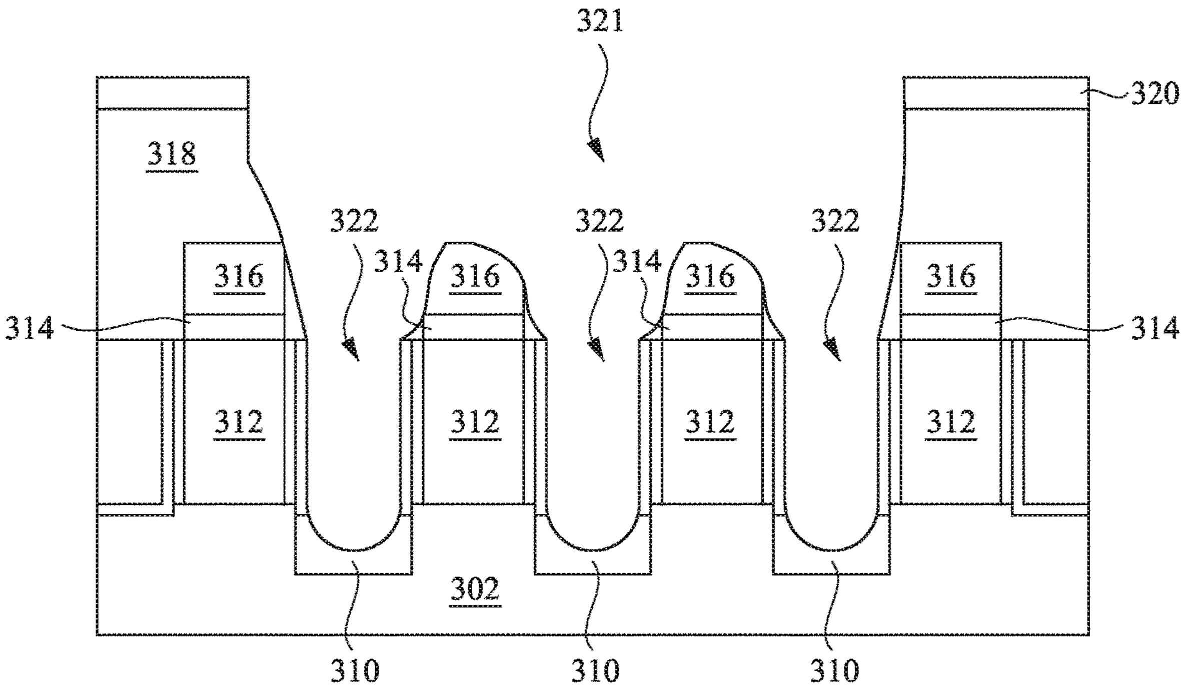
Figure 3G:
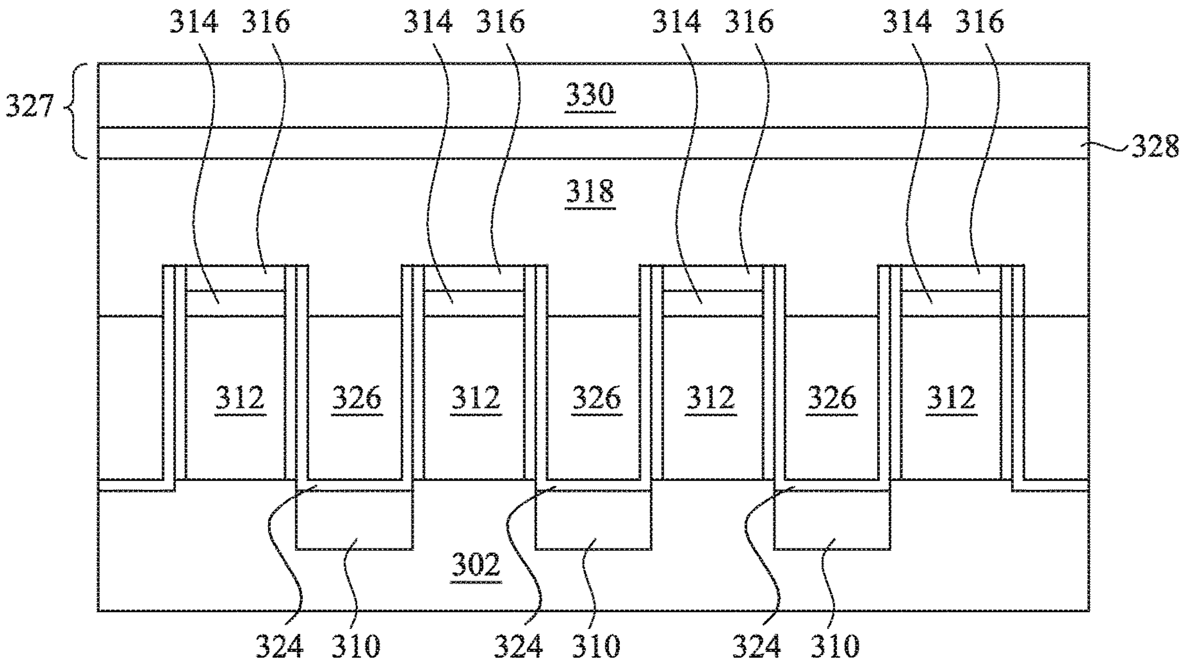
Figure 3H:
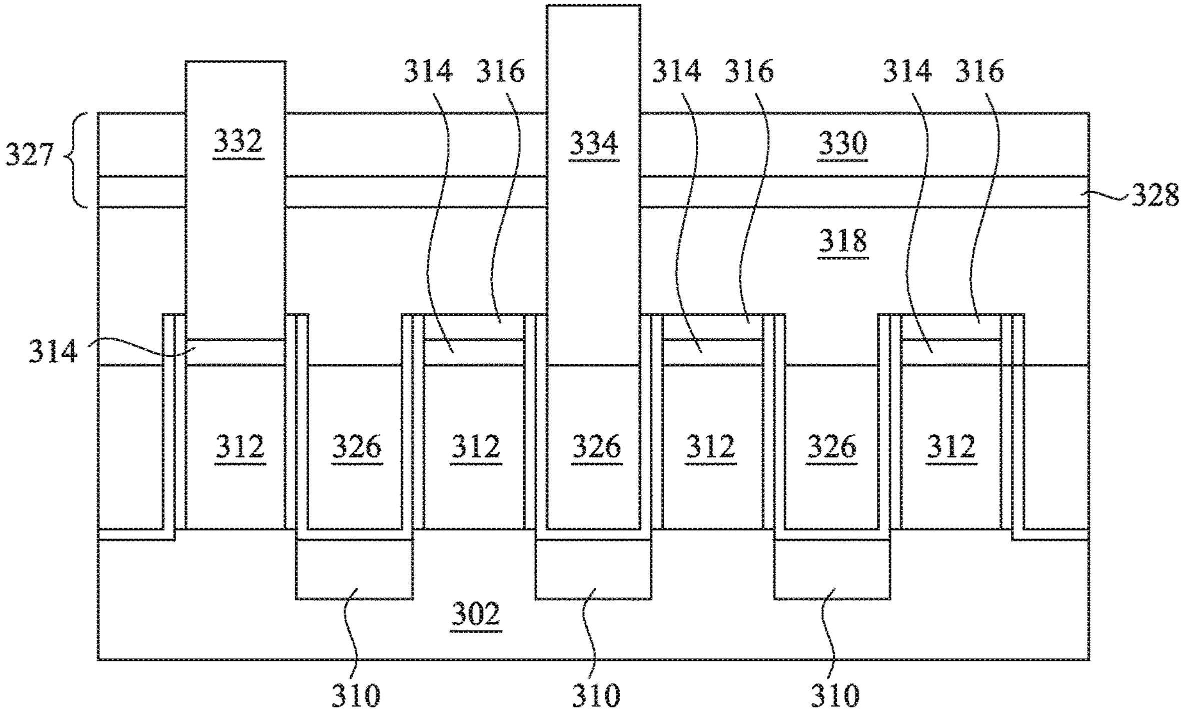

At block 218, the example process 200 includes forming a patterned mask that exposes a portion of the ILD1 layer. In various embodiments, forming a patterned mask involves forming a hard mask (e.g., hard mask 320 as illustrated in FIG. 3E) over the ILD1 layer 318 and patterning the hard mask 320 to expose a portion of the ILD1 layer 318 that extends over S/D regions 310 above which MDs are subsequently formed. The patterned mask may include a photo resist layer. The patterned mask may be formed by photoresist coating (e.g., spin-on coating), soft baking, mask aligning, exposure, post-exposure baking, developing the photoresist, rinsing, drying (e.g., hard baking), and/or combinations thereof. In some other embodiments, various imaging enhancement layers may be formed under photo resist layer to enhance the pattern transfer. The imaging enhancement layer may comprise a tri-layer including a bottom organic layer, a middle inorganic layer and a top organic layer. The imaging enhancement layer may also include an anti-reflective coating (ARC) material, a polymer layer, an oxide derived from TEOS (tetraethylorthosilicate), silicon oxide, or a Si-containing anti-reflective coating (ARC) material, such as a 42% Si-containing ARC layer. In yet some other embodiments, the patterned mask layer includes a hard mask layer. The hard mask layer includes an oxide material, silicon nitride, silicon oxynitride, an amorphous carbon material, silicon carbide or tetraethylorthosilicate (TEOS).

At block 220, the example process 200 includes selectively removing the exposed portion of the ILD1 layer and the ILD0 layer over the S/D regions to form openings that expose the underlying source/drain regions. Referring to the example of FIG. 3F, in an embodiment of block 220, the example semiconductor structure includes an opening 321 in the ILD1 layer 318 and openings 322 in the ILD0 308 layers. The ILD1 layer 318 and ILD0 layer 308 are selectively removed to create the openings 321 and 322 to expose the S/D regions 310. The exposed portions of the ILD layer 318 and ILD layer 308 can be removed by suitable etching process, such as wet etching, dry etching, or combination thereof. The dielectric gate cap layer 316, along with the metal cap layer 314, protect the MG 312 during etching operations to expose the S/D regions 310.

At block 222, the example process 200 includes optionally forming silicide contacts on the source/drain regions that have been exposed. The optional silicide contact may comprise titanium (e.g., titanium silicide (TiSi)) in order to reduce the Schottky barrier height of the contact. However, other metals, such as nickel, cobalt, erbium, platinum, palladium, and the like, may also be used. A silicidation may be performed by blanket deposition of an appropriate metal layer, followed by an annealing step which causes the metal to react with the underlying exposed silicon of the source/drain regions. Referring to the example of FIG. 3G, in an embodiment after completion of block 222, the semiconductor structure includes the optionally formed silicide contacts 324 on the source/drain regions 310 that have been exposed.

At block 224, the example process 200 includes filling a conductive material in the openings contacting the source/drain regions to form source/drain contacts (also referred to herein as metal drain (MD) contacts). The source/drain contact may comprise one or more layers. For example, in some embodiments, the source/drain contact comprise a liner and a metal fill material (not individually shown) deposited by, for example, CVD, ALD, electroless deposition (ELD), PVD, electroplating, or another deposition technique. The liner, such as a diffusion barrier layer, an adhesion layer, or the like, may include titanium, titanium nitride, tantalum, tantalum nitride, or the like. The conductive material may be copper, a copper alloy, silver, gold, tungsten, cobalt, aluminum, ruthenium, nickel, or the like. A planarization process, such as a CMP, may be performed to remove excess liner and conductive material. The remaining liner and conductive material form the source/drain contact in the opening. Referring again to the example of FIG. 3G, in an embodiment after completion of block 224, the semiconductor structure further includes a conductive material filling the openings 322 (shown in FIG. 3F) and contacting the source/drain regions 310 to form source/drain contacts (MD 326).

At block 226, the example process 200 includes filling the opening over the source/drain and gate regions with ILD1 material to fill in the ILD1 layer and forming one or more intermetal dielectric (IMD) layers over the ILD1 layer. Each IMD layer may include an etch stop layer (ESL) above the underlying layer and an ILD layer above the ESL. The ESL may be deposited using one or more low temperature deposition processes such as chemical vapor deposition, physical vapor deposition, or atomic layer deposition. Referring again to the example of FIG. 3G, in an embodiment after completion of block 226, the semiconductor structure further includes the ILD1 layer 318 and an IMD layer 327 that includes an ESL 328 and an ILD2 layer 330. In this example the height of the MG 312 is not equal to the height of the MD 326.

The ILD2 layer 330 may be formed of a dielectric material such as oxides (e.g., silicon oxide ($SiO_2$)) and may be deposited by any acceptable process (e.g., CVD, PEALD, thermal ALD, PECVD, or the like). The ILD2 layer 330 may also be formed of other suitable insulation materials (e.g., PSG, BSG, BPSG, USG, or the like) deposited by any suitable method (e.g., CVD, PECVD, flowable CVD, or the like). After formation, the ILD2 layer 330 may be cured, such as by an ultraviolet curing process.

At block 228, the example process 200 includes forming one or more contact VIA (vertical interconnect access) openings for use in connecting a metal line in an IMD layer to a MD contact or a MG contact. Contact VIA openings for a gate VIA (VG) contact and a source/drain VIA (VD) contact are formed through using one or more etching processes. According to some embodiments, openings for the VG contact and for the VD contact are formed through the second ILD layer, the CESL, and the first ILD layer. The openings may be formed using any combination of acceptable photolithography and suitable etching techniques such as dry etching process (e.g., plasma etch, reactive ion etch (RIE), physical etching (e.g., ion beam etch (IBE))), wet etching, combinations thereof, and the like. However, any suitable etching processes may be utilized to form the contact VIA openings.

At block 230, the example process 200 includes forming VG contacts and VD contacts. The VG contact is formed over and electrically coupled to the MG and the VD contact is formed over and electrically coupled to MD contacts. The VG contacts and/or the VD contacts can be formed by depositing metal material in an opening. The metal material may be deposited by CVD, ALD, electroless deposition (ELD), PVD, electroplating, or another deposition technique. The VG contacts and/or the VD contacts may be or comprise tungsten, cobalt, copper, ruthenium, aluminum, gold, silver, alloys thereof, the like, or a combination thereof. Referring to the example of FIG. 3H, in an embodiment after completion of blocks 228 and 230, the semiconductor structure includes VG contacts 332 and VD contacts 334.

At block 232, the example process 200 includes performing further fabrication operations. A semiconductor device may undergo further processing to form various features and regions known in the art. For example, subsequent processing may form various contacts/VIAs/lines and multilayer interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as VIAs or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the process 200, and some process steps described above may be replaced or eliminated in accordance with various embodiments of the process 200.

Figure 3I:
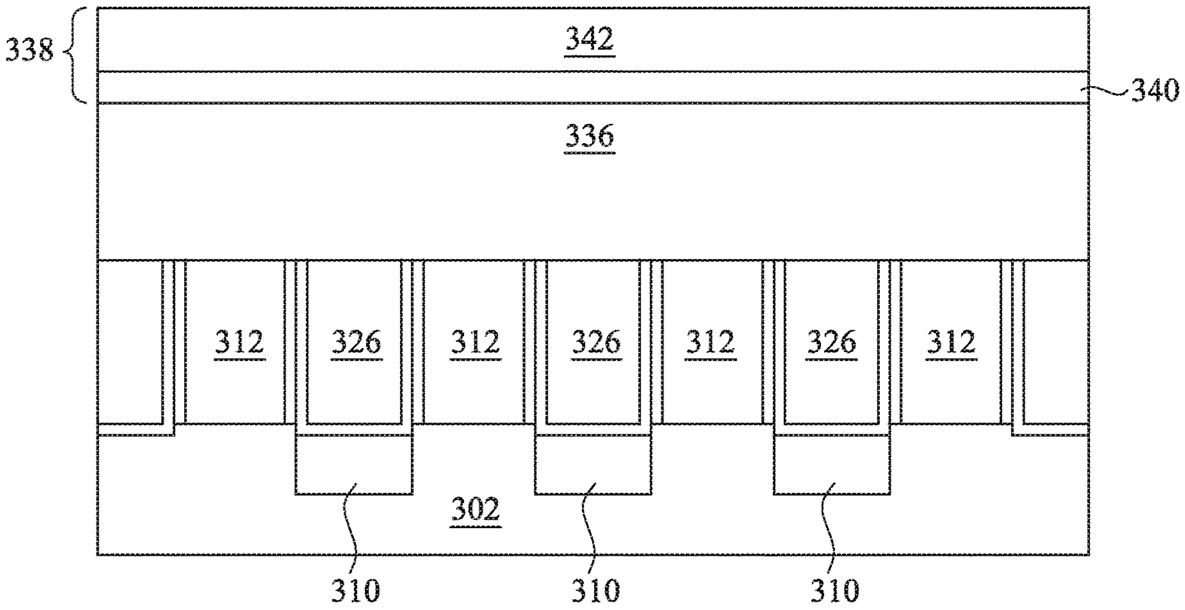
FIGS. 3I-3J are cross-sectional views of a semiconductor device, which illustrate the semiconductor device at various stages of fabrication, in accordance with some embodiments.
Figure 3J:
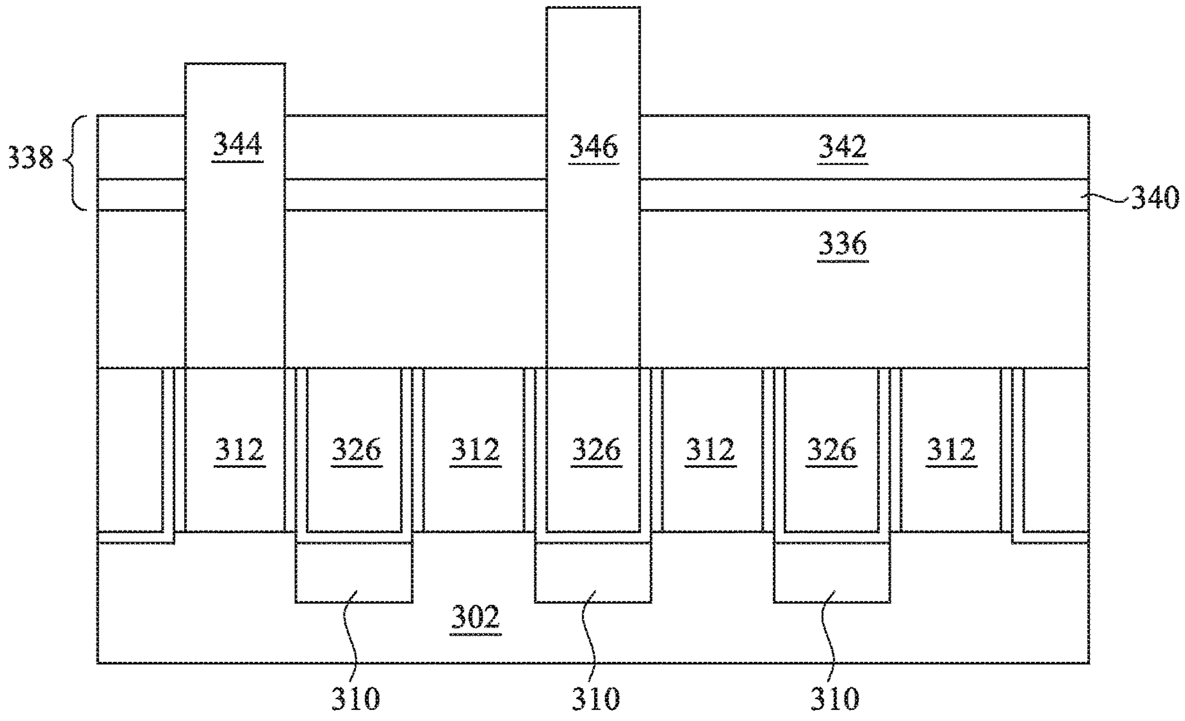
Figure 4:
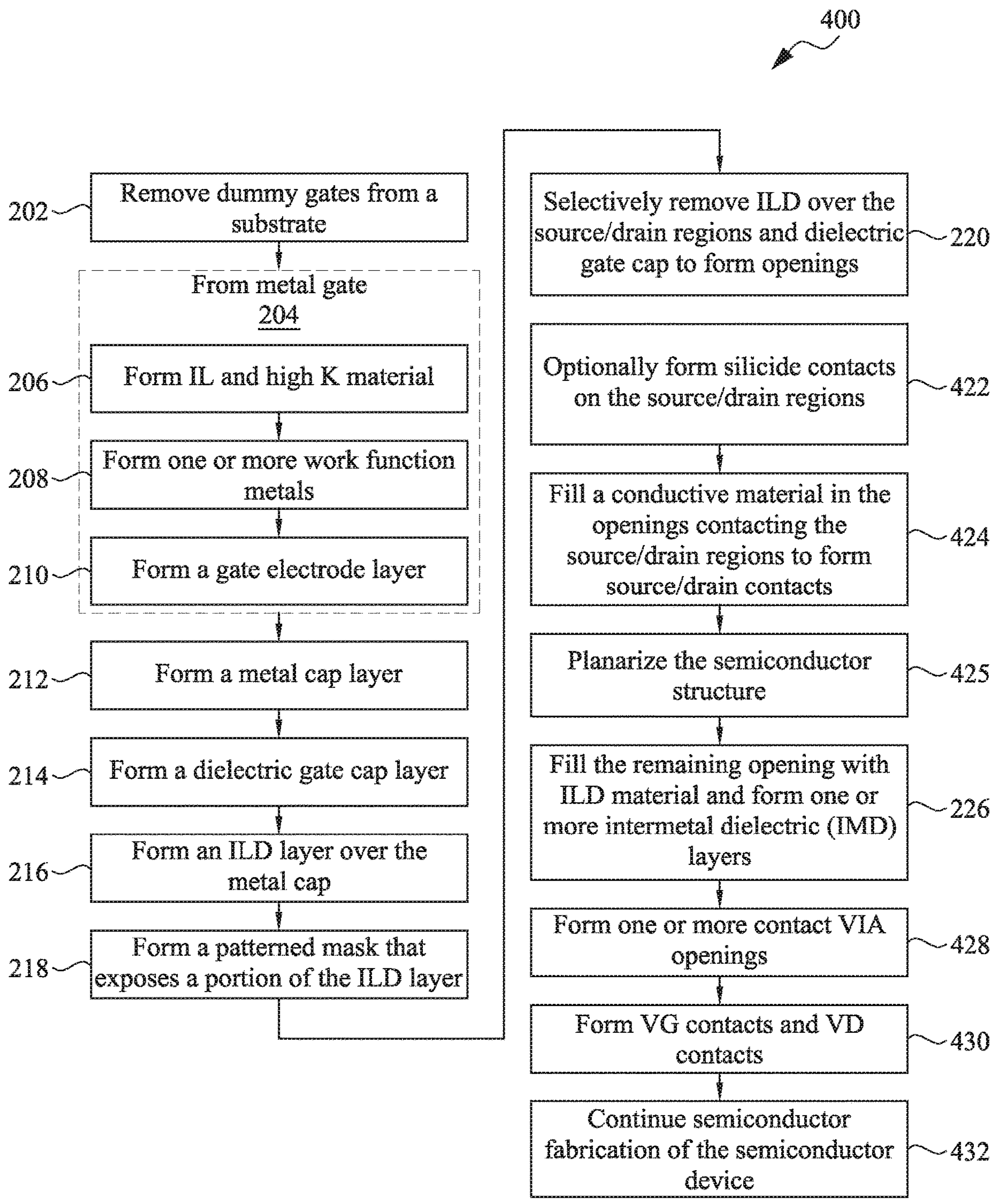
FIG. 4 is a process flow chart depicting an example process for forming FETs in a semiconductor device, in accordance with some embodiments.

FIG. 4 is a process flow chart depicting an example process 400 for forming FETs in a semiconductor device. Process 400 includes blocks 202-220 as described with respect to process 200, but also includes additional blocks. The additional blocks of process 400 are described in conjunction with FIGS. 3I-3J, which are cross-sectional views of a semiconductor device, which illustrate the semiconductor device at various stages of fabrication in accordance with some embodiments of the present disclosure of the example process 400. The process 400 is merely an example, and is not intended to limit the present disclosure beyond what is explicitly recited in the claims. Additional steps may be provided before, during, and after example process 400, and some of the steps described can be moved, replaced, or eliminated for additional embodiments of example process 400. Additional features may be added in the semiconductor device depicted in the figures and some of the features described below can be replaced, modified, or eliminated in other embodiments of the semiconductor device.

It is understood that parts of the semiconductor device may be fabricated by typical semiconductor technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, and/or other logic devices, etc., but is simplified for a better understanding of concepts of the present disclosure. In some embodiments, the exemplary devices include a plurality of semiconductor devices (e.g., transistors), including PFETs, NFETs, etc., which may be interconnected. Moreover, it is noted that the operations of process 400, including any descriptions given with reference to the Figures are merely exemplary and are not intended to be limiting beyond what is specifically recited in the claims that follow.

FIGS. 3I-3J are diagrams depicting enlarged views of an example semiconductor structure at various stages of fabricating a semiconductor device, in accordance with some embodiments. In some figures, some reference numbers of components or features illustrated therein may be omitted to avoid obscuring other components or features; this is for ease of depicting the figures.

Process 400 includes blocks 202-220 as described above with respect to process 200 and FIG. 2. Process 400 includes additional blocks beginning at block 422.

At block 422, the example process 400 includes optionally forming silicide contacts on the source/drain regions that have been exposed. The optional silicide contact may comprise titanium (e.g., titanium silicide (TiSi)) in order to reduce the Schottky barrier height of the contact. However, other metals, such as nickel, cobalt, erbium, platinum, palladium, and the like, may also be used. A silicidation may be performed by blanket deposition of an appropriate metal layer, followed by an annealing step which causes the metal to react with the underlying exposed silicon of the source/drain regions. Referring to the example of FIG. 3I, in an embodiment after completion of block 422, the semiconductor structure includes optionally formed silicide contacts 324 on the source/drain regions 310 that have been exposed.

At block 424, the example process 400 includes filling a conductive material in the openings contacting the source/drain regions to form a MD contact. The MD contact may comprise one or more layers. For example, in some embodiments, the MD contact comprise a liner and a metal fill material (not individually shown) deposited by, for example, CVD, ALD, electroless deposition (ELD), PVD, electroplating, or another deposition technique. The liner, such as a diffusion barrier layer, an adhesion layer, or the like, may include titanium, titanium nitride, tantalum, tantalum nitride, or the like. The conductive material may be copper, a copper alloy, silver, gold, tungsten, cobalt, aluminum, ruthenium, nickel, or the like. A planarization process, such as a CMP, may be performed to remove excess liner and conductive material. The remaining liner and conductive material form the source/drain contact in the opening. Referring again to the example of FIG. 3I, in an embodiment after completion of block 424, the semiconductor structure further includes a conductive material filling the openings 322 (shown in FIG. 3F) and contacting the source/drain regions 310 to form MD 326.

At block 425, the example process 400 includes planarizing the semiconductor structure. The planarizing may include the performance of chemical mechanical polishing (CMP) operations to remove the dielectric gate cap layer 316 and metal cap layer 314. The planarizing may result in the MG 312, MD 326, and the one or more spacer layers 306 having substantially the same height. Referring again to the example of FIG. 3I, in an embodiment after completion of block 425, the semiconductor structure further includes the MG 312, MD 326, and the one or more spacer layers 306 having substantially the same height.

At block 426, the example process 400 includes filling the opening over the source/drain and gate regions with ILD1 material to fill in the ILD1 layer and forming one or more intermetal dielectric (IMD) layers over the ILD1 layer. Each IMD layer may include an etch stop layer (ESL) above the underlying layer and an ILD layer above the ESL. The ESL may be deposited using one or more low temperature deposition processes such as chemical vapor deposition, physical vapor deposition, or atomic layer deposition. Referring again to the example of FIG. 3I, in an embodiment after completion of block 426, the semiconductor structure further includes an ILD1 layer 336 and an IMD layer 338 that includes an ESL 340 and an ILD2 layer 342. In this example the height of the MG 312 is substantially equal to the height of the MD 326.

The ILD2 layer 342 may be formed of a dielectric material such as oxides (e.g., silicon oxide ($SiO_2$)) and may be deposited by any acceptable process (e.g., CVD, PEALD, thermal ALD, PECVD, or the like). The ILD2 layer 342 may also be formed of other suitable insulation materials (e.g., PSG, BSG, BPSG, USG, or the like) deposited by any suitable method (e.g., CVD, PECVD, flowable CVD, or the like). After formation, the ILD2 layer 342 may be cured, such as by an ultraviolet curing process.

At block 428, the example process 400 includes forming one or more contact VIA (vertical interconnect access) openings for use in connecting a metal line in an IMD layer to a MD contact or a MG contact. Contact VIA openings for a gate VIA (VG) contact and a source/drain VIA (VD) contact are formed through using one or more etching processes. According to some embodiments, openings for the VG contact and for the VD contact are formed through the second ILD layer, the CESL, and the first ILD layer. The openings may be formed using any combination of acceptable photolithography and suitable etching techniques such as dry etching process (e.g., plasma etch, reactive ion etch (RIE), physical etching (e.g., ion beam etch (IBE))), wet etching, combinations thereof, and the like. However, any suitable etching processes may be utilized to form the contact VIA openings.

At block 430, the example process 400 includes forming VG contacts and VD contacts. The VG contact is formed over and electrically coupled to the MG and the VD contact is formed over and electrically coupled to MD contacts. The VG contacts and/or the VD contacts can be formed by depositing metal material in an opening. The metal material may be deposited by CVD, ALD, electroless deposition (ELD), PVD, electroplating, or another deposition technique. The VG contacts and/or the VD contacts may be or comprise tungsten, cobalt, copper, ruthenium, aluminum, gold, silver, alloys thereof, the like, or a combination thereof. Referring to the example of FIG. 3J, in an embodiment after completion of blocks 428 and 430, the semiconductor structure includes VG contacts 344 and VD contacts 346.

At block 432, the example process 200 includes performing further fabrication operations. A semiconductor device may undergo further processing to form various features and regions known in the art. For example, subsequent processing may form various contacts/VIAs/lines and multilayer interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as VIAs or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the process 400, and some process steps described above may be replaced or eliminated in accordance with various embodiments of the process 400.

Although the foregoing examples were illustrated with respect to FinFET devices, the foregoing apparatus, devices, and methods may also be used in connection with other semiconductor transistor technologies such as gate all around (GAA) and planar transistor technologies.

Figure 5:
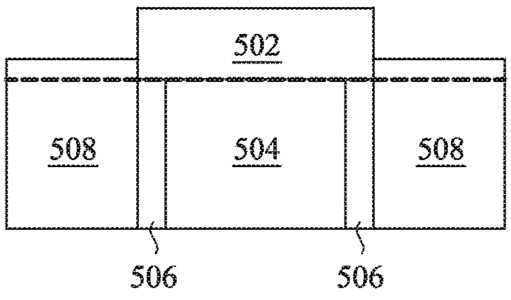
FIG. 5 is a block diagram illustrating an example dielectric gate cap, in accordance with some embodiments.
Figure 6:
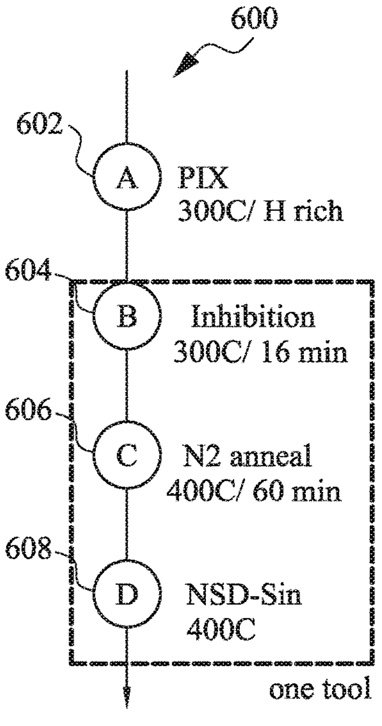
FIG. 6 is a flow diagram illustrating an example SND (self-navigate deposition) process for forming an example dielectric gate cap, in accordance with some embodiments.

FIG. 5 illustrates an example dielectric gate cap 502 that was formed above a MG 504 using a SND process, and FIG. 6 is a flow diagram illustrating an example SND process 600 for forming the example dielectric gate cap 502. The SND process 600 of FIG. 6 is described with reference to FIGS. 5 and 7A-7D, wherein FIGS. 7A-7D graphically illustrate various process stages of the example SND process 600.

As illustrated in FIG. 5, an example dielectric gate cap 502 has been formed over a MG 504 and gate spacers 506, but not over an ILD0 layer 508 over an S/D region. The example dielectric gate cap 502 was formed using a SND process 600 that includes a surface treatment stage 602, an inhibition stage 604, an anneal treatment stage 606, and a deposition stage 608. In this example, the surface treatment stage 602 is performed in an inductively coupled plasma (ICP) chamber. The inhibition stage 604, anneal treatment stage 606, and deposition stage 608 are all performed in a furnace and in various embodiments performed in the same furnace.

Figure 7A:
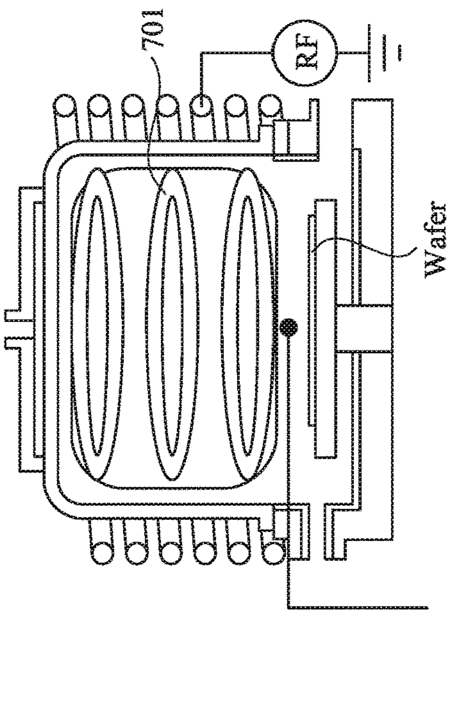
FIGS. 7A-7D are diagrams providing graphical illustrations of various process stages of the example SND process, in accordance with some embodiments.

At the surface treatment stage 602, the surface of the ILD0 layer 508 above an S/D region is treated in an inductively coupled plasma (ICP) chamber 701 as illustrated in FIG. 7A to reduce oxygen (O) content. The surface treatment involves subjecting the substrate (e.g., substrate 302) to a hydrogen (H) rich environment at a temperature of about 300° C. The surface treatment results in oxidation of the surface (e.g., surface 315) of the metal cap layer (e.g., metal cap layer 314) and oxygen reduction of the top surface (e.g., surface 309) of the ILD0 layer 308.

Figure 7B:
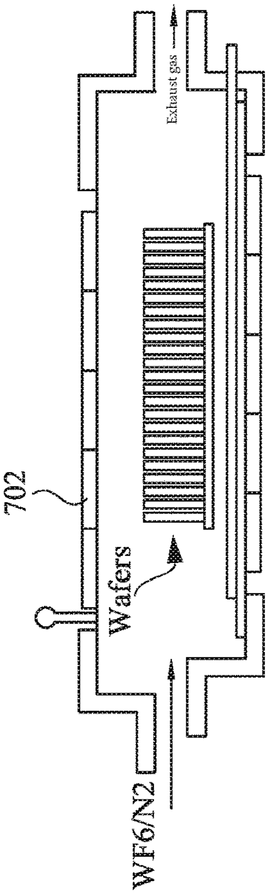

The inhibition stage 604 involves applying tungsten hexafluoride ($WF_6$) gas and nitrogen ($N_2$) gas to the substrate 302 in the furnace 702, as illustrated in FIG. 7B, at a temperature of about 300° C. for 16 minutes. In various embodiments, the inhibition stage 604 results in fluorine (F) from the $WF_6$ bonding to Si atoms on the surface of the ILD0 layer.

Figure 7C:
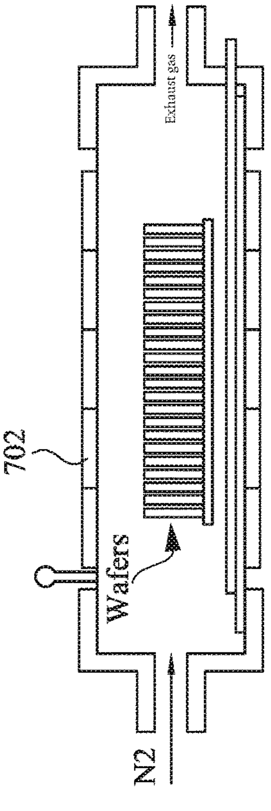

The anneal treatment stage 606 involves annealing the substrate 302 in the furnace 702 as illustrated in FIG. 7C. In various embodiments, annealing the substrate 302 involves applying $N_2$ gas to the substrate 302 in the furnace 702 at 400° C. for 60 minutes. In various embodiments, the anneal treatment stage 606 results in moisture removal.

Figure 7D:
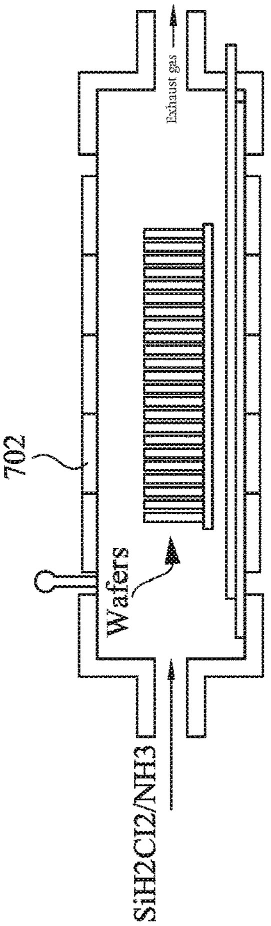

The deposition stage 608 involves growing the dielectric cap layer above the gate region but not above the S/D regions. In various embodiments, the deposition stage 608 involves depositing SiN using a thermal ALD process in the furnace 702 as illustrated in FIG. 7D. In various embodiments, the thermal ALD process involves treating the substrate 302 at 400° C. with $SiH_2Cl_2$ and $NH_3$. In various embodiments, the thermal ALD process results in the deposition of SiN over a metal cap or the MG in the gate region, without growth of SiN over the ILD0 layer over the S/D region.

Figure 8:
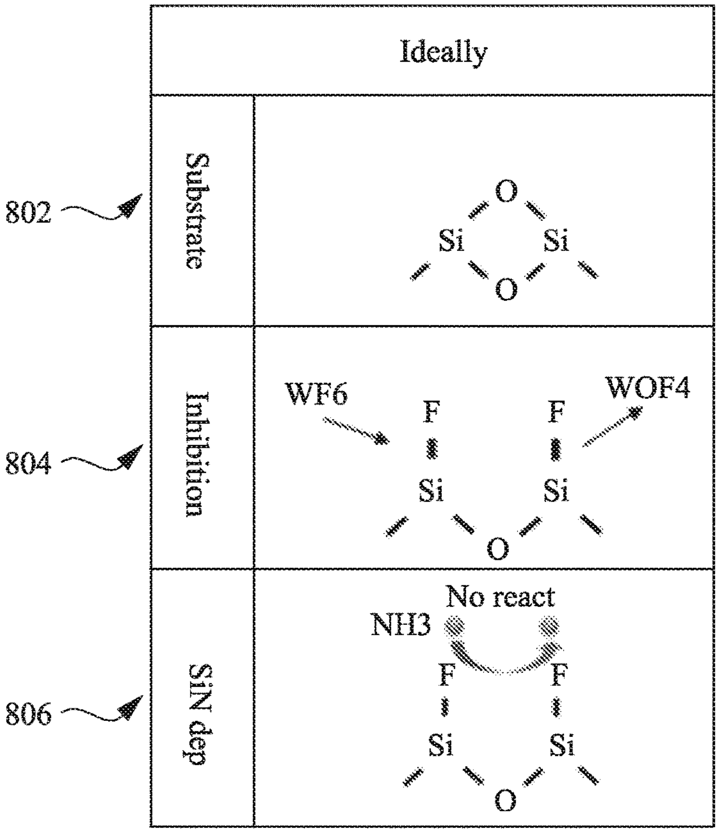
FIG. 8 is a diagram providing a graphical illustration of example chemical operations taking place during an SND process, in accordance with some embodiments.

FIG. 8 illustrates example operations during an SND process. At block 802, before a surface treatment stage, oxygen is bonded to silicon in the silicon oxide from the ILD0 oxide layer. Surface treatment can result in oxygen reduction of the surface of ILD0 layer. At block 804, during an inhibition stage, $WF_6$ is introduced into a furnace, F atoms from the $WF_6$ bonds to the Si (after oxygen reduction), and $WOF_4$ is a byproduct that is output from the furnace as exhaust gas. At block 806, during a deposition stage, $NH_3$, which is introduced to grow the dielectric cap layer over the gate region, does not react to the oxide layer and resultingly dielectric cap layer material (e.g., SiN) is not deposited or grown on the ILD oxide.

Figure 9A:
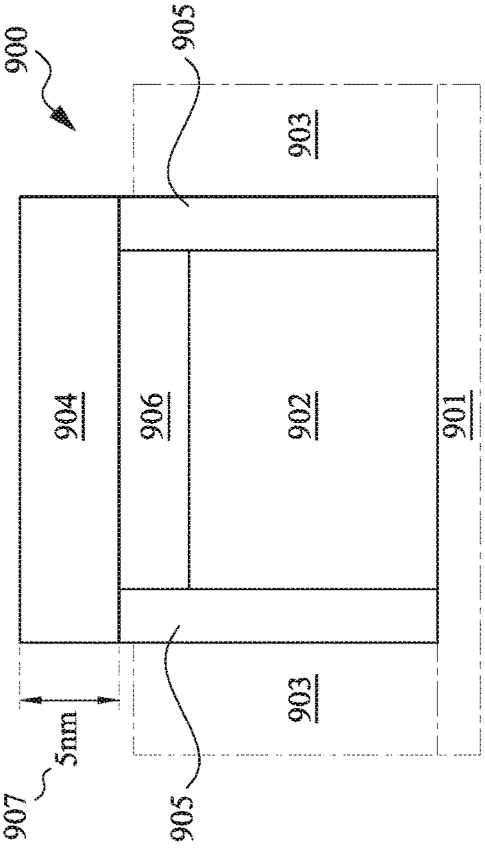
FIGS. 9A-9D are diagrams illustrating the chemical makeup of an example semiconductor structure after formation of a dielectric gate cap using an SND process, in accordance with some embodiments.

FIGS. 9A, 9B, 9C, and 9D are diagrams illustrating properties of an example dielectric gate cap layer that has been formed above a MG using an SND process. FIG. 9A illustrates an example semiconductor structure 900 with a MG 902 (e.g., formed from TiN) disposed between an ILD layer 903 on a substrate 901, an optional metal cap layer 906 disposed above the MG 902, a dielectric gate cap layer 904 formed above the MG 902 and the optional metal cap layer 906, and a plurality of gate spacers 905 formed between the ILD layer 903 and the MG 902 on the substrate. In this example, the dielectric gate cap layer 904 has a height 907 of about 5 nanometers (nm) and is formed from SiN using an SND process.

Figure 9B:
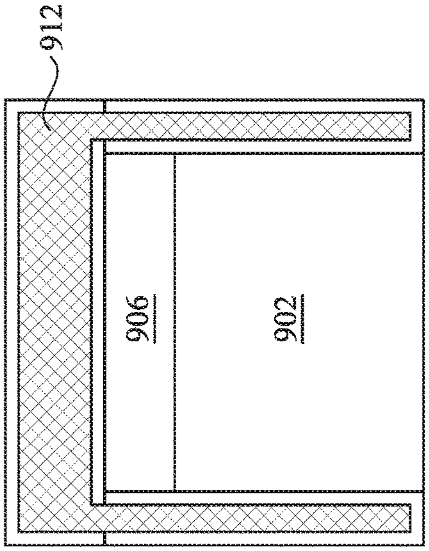
Figure 9C:
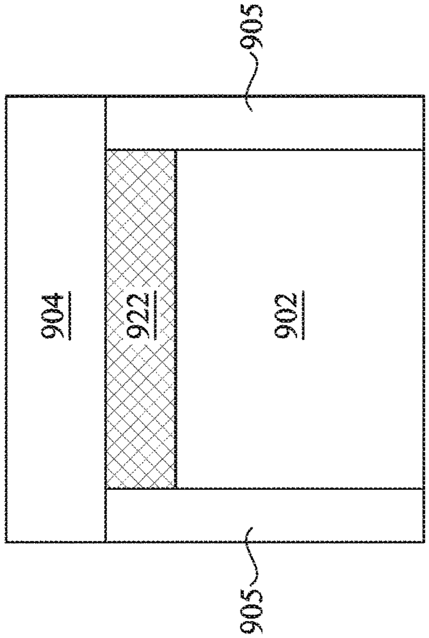
Figure 9D:
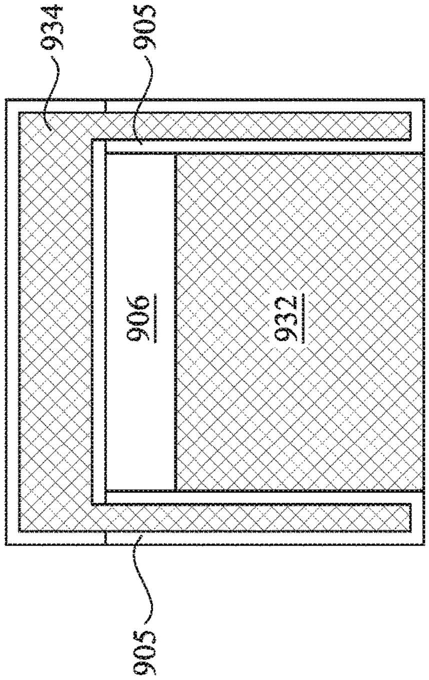

FIG. 9B illustrates Si content 912 in the dielectric gate cap layer 904. FIG. 9C illustrates tungsten (W) content 922 in the metal cap layer 906 at the interface between the MG 902 and the dielectric gate cap layer 904. FIG. 9D illustrates a first concentration 932 of nitrogen (N) in the MG 902 (formed from TiN) and a second concentration 934 of N in the dielectric gate cap layer 904 (formed from SiN). In various embodiments, as illustrated in the example table of FIG. 9E, the dielectric gate cap layer 904 comprises a Si concentration of less than 40%, a nitrogen (N) concentration of less than 45%, and an oxygen (O) concentration of greater than 25%.

FIG. 9E is a table 940 illustrating example concentrations of various elements in a dielectric gate cap (e.g., dielectric gate cap layer 904) formed above a MG (e.g., MG 902). Column 942 identifies the various elements that may be in the dielectric gate cap. Column 944 identifies the percentage concentration of the various elements in an example dielectric gate cap when the dielectric gate cap was formed from SiN using a SND process. Column 946 identifies the percentage concentration of the various elements in an example dielectric gate cap when the dielectric gate cap was formed from SiN using a SND process with a surface pretreatment step performed prior to the SND process. Column 948 identifies the concentration percentage of the various elements in an example dielectric gate cap when the dielectric gate cap was formed from SiN using a deposition process other than an SND process. Table 940 illustrates an example in which the ratio of N:O:Si was about 1:1:1 (e.g., approximately 33% concentration of each of N, O, and Si) when an SND process was used to form the dielectric gate cap, but the ratio of N:O:Si was about 1:0:1 when a process other than an SND process was used to form the dielectric gate cap. Table 940 illustrates in this example that N made up about 50% of the elements and Si made up about 50% of the elements in a SiN dielectric gate cap formed in a process other than an SND process. Table 940 illustrates that in this example N made up about 33% of the elements, O made up about 33% of the elements, and Si made up about 33% of the elements in a SiN dielectric gate cap formed in an SND process. Table 940 illustrates that in this example the concentration of O was lower in the SND plus pretreatment process than in the SND process without pretreatment. In various embodiments, the dielectric gate cap (e.g., dielectric gate cap layer 904) has a thickness of about 5.05 nanometers or less.

In various embodiments, as illustrated by Table 940, the dielectric gate cap (e.g., dielectric gate cap layer 904) includes a Si concentration of less than 40%, a nitrogen (N) concentration of less than 45%, and an oxygen (O) concentration of greater than 25% when an SND process was used to form the dielectric gate cap or an SND process with a surface pretreatment step performed prior to the SND process was used to form the dielectric gate cap.

In various embodiments, as illustrated by Table 940, the dielectric gate cap (e.g., dielectric gate cap layer 904) includes a Si concentration of less than 35%, a nitrogen (N) concentration of less than 40%, and an oxygen (O) concentration of greater than 25% when an SND process was used to form the dielectric gate cap or an SND process with a surface pretreatment step performed prior to the SND process was used to form the dielectric gate cap.

In various embodiments, as illustrated by Table 940, the dielectric gate cap (e.g., dielectric gate cap layer 904) includes a Si concentration of less than 35%, a nitrogen (N) concentration of less than 35%, and an oxygen (O) concentration of greater than 30% when an SND process was used to form the dielectric gate cap.

In various embodiments, as illustrated by Table 940, the dielectric gate cap (e.g., dielectric gate cap layer 904) includes a Si concentration of less than 35%, a nitrogen (N) concentration of less than 40%, and an oxygen (O) concentration of greater than 25% when an SND process with a surface pretreatment step performed prior to the SND process was used to form the dielectric gate cap.

In various embodiments, as illustrated by Table 940, the dielectric gate cap (e.g., dielectric gate cap layer 904) includes a Si concentration of between 25% to 35% and a N concentration of between 25% to 40% when an SND process was used to form the dielectric gate cap or an SND process with a surface pretreatment step performed prior to the SND process was used to form the dielectric gate cap.

In various embodiments, as illustrated by Table 940, the dielectric gate cap (e.g., dielectric gate cap layer 904) includes an O concentration of between 25% to 40% when an SND process was used to form the dielectric gate cap or an SND process with a surface pretreatment step performed prior to the SND process was used to form the dielectric gate cap.

Figure 10A:
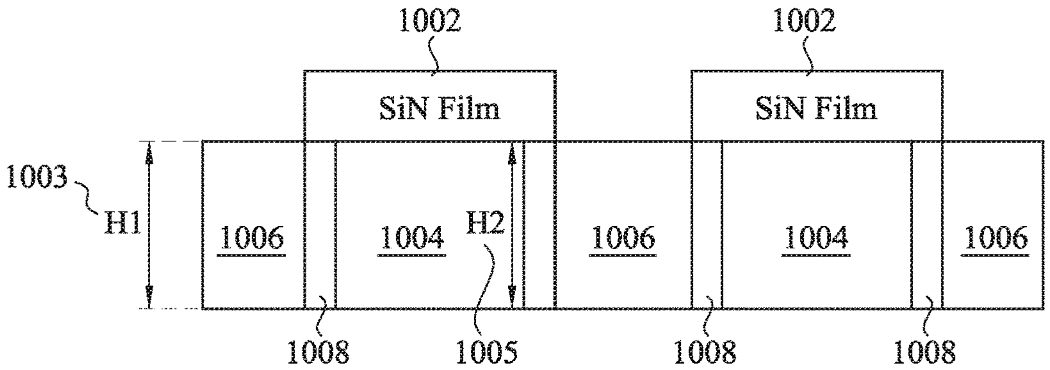
FIGS. 10A-10C are block diagrams illustrating that the SND process for forming a dielectric gate cap can be applied to transistors having different height ratios between a MG and the ILD layer over an S/D region, in accordance with some embodiments.
Figure 10B:
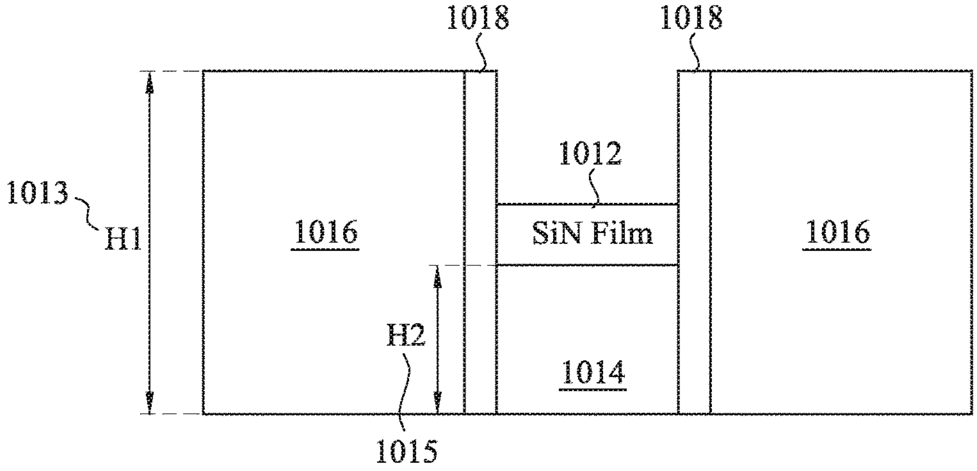
Figure 10C:
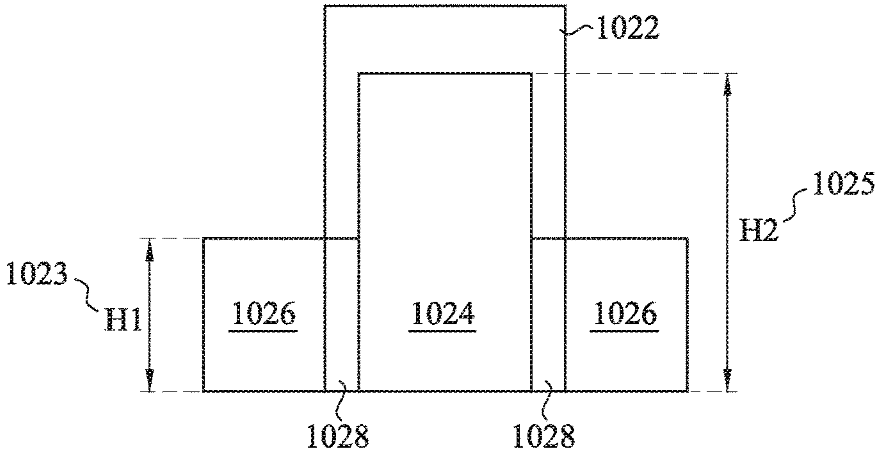

FIGS. 10A, 10B, and 10C are diagrams illustrating that the SND process for forming a dielectric gate cap can be applied to transistors that have different gate region to S/D region height ratios. FIG. 10A illustrates that the SND process for forming a dielectric gate cap layer 1002 can be applied to transistors having a MG 1004 that is approximately the same height as the ILD layer 1006 over an S/D region and gate spacers 1008. FIG. 10B illustrates that the SND process for forming a dielectric gate cap layer 1012 can be applied to transistors having a MG 1014 that is lower in height than the ILD layer 1016 over an S/D region and gate spacers 1018. FIG. 10C illustrates that the SND process for forming a dielectric gate cap layer 1022 can be applied to transistors having a MG 1024 that is higher in height than the ILD layer 1026 over an S/D region and gate spacers 1028.

In each of these examples, the dielectric gate cap layer (1002, 1012, 1022) is formed above the gate region (1004, 1014, 1024), but not above the ILD layer (1006, 1016, 1026) over an S/D region. Etching of dielectric gate cap layer material is not needed above the ILD layer (1006, 1016, 1026) over an S/D region because the dielectric gate cap layer material is grown above the gate region (1004, 1014, 1024) and not above the ILD layer (1006, 1016, 1026) over an S/D region. Consequently, the height of the dielectric gate cap layer (1002, 1012, 1022) can be smaller using the SND process than it would need to be in a process other than an SND process were used because dielectric gate cap layer height will not be lost due to etching excess dielectric gate cap layer material from above the ILD layer (1006, 1016, 1026) over an S/D region.

In various embodiments, as illustrated in FIG. 10A, the ILD layer 1006 and the gate spacers 1008 have a first height (H1) 1003, the MG 1004 has a second height (H2) 1005, the first height is approximately equal to the second height, and the dielectric gate cap layer 1002 is formed above the MG 1004 and the plurality of gate spacers, but not the ILD layer 1006.

In various embodiments, as illustrated in FIG. 10B, the ILD layer 1016 and the gate spacers 1018 have a first height (H1) 1013, the MG 1014 has a second height (H2) 1015, the first height 1013 is higher than the second height 1015, and the dielectric gate cap layer 1012 is formed above the MG 1014, but not the ILD layer 1016 or the gate spacers 1018.

In various embodiments, as illustrated in FIG. 10C, the ILD layer 1026 and the gate spacers 1028 have a first height (H1) 1023, the MG 1024 has a second height (H2) 1025, the first height 1023 is lower than the second height 1025, and the dielectric gate cap layer 1022 is formed above the MG 1024 and the gate spacers 1028, but not the ILD layer 1026.

In some aspects, the techniques described herein relate to a fabrication method, including: forming a gate structure between an interlayer dielectric (ILD) layer on a substrate; forming a metal cap layer over the gate structure; and selectively depositing a dielectric cap layer over the metal cap layer by: performing inhibition operations in a furnace to prevent dielectric cap layer material from growing on the ILD layer; performing an anneal treatment on the substrate in a furnace; and selectively growing the dielectric cap layer over the metal cap layer in a furnace.

In some aspects, the techniques described herein relate to a fabrication method, including: forming a gate structure between an interlayer dielectric (ILD) layer on a substrate; and selectively depositing a dielectric cap layer including silicon nitride (SiN) over the gate structure by: treating a substrate surface to reduce oxygen (O) content in a top surface of the ILD layer; performing inhibition operations in a furnace to prevent SiN from growing on the ILD layer; performing an anneal treatment on the substrate in a furnace; and selectively growing the SiN over the gate structure in a furnace.

In some aspects, the techniques described herein relate to a semiconductor device, including: a gate structure disposed between an interlayer dielectric (ILD) layer on a substrate; a plurality of gate spacers formed between the ILD layer and the gate structure on the substrate; and a silicon nitride (SiN) dielectric cap formed over the gate structure, wherein the SiN dielectric cap includes a Si concentration of less than 40%, a nitrogen (N) concentration of less than 45%, and an oxygen (O) concentration of greater than 25%.

In some aspects, the techniques described herein relate to a fabrication method, including: forming a gate structure between an interlayer dielectric (ILD) layer on a substrate; and selectively depositing a dielectric cap layer including silicon nitride (SiN) over the gate structure by: treating a substrate surface to reduce oxygen (O) content in a top surface of the ILD layer; performing inhibition operations in a furnace to prevent SiN from growing on the ILD layer; performing an anneal treatment on the substrate in a furnace; and selectively growing the SiN over the gate structure in a furnace.

In some aspects, the techniques described herein relate to a fabrication method, including: forming a gate structure between an interlayer dielectric (ILD) layer on a substrate; forming a metal cap layer over the gate structure; treating a substrate surface in an inductively coupled plasma (ICP) chamber, the treating including oxidation of a surface of the metal cap layer and reducing oxygen (O) content in a top surface of the ILD layer; performing inhibition operations in a furnace to prevent SiN from growing on the ILD layer; performing an anneal treatment on the substrate in the furnace; and selectively growing a SiN dielectric cap over the gate structure in the furnace.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A fabrication method, comprising:
- forming a gate structure between an interlayer dielectric (ILD) layer on a substrate;
- forming a metal cap layer over the gate structure; and
- selectively depositing a dielectric cap layer over the metal cap layer by:
- performing inhibition operations in a furnace to prevent dielectric cap layer material from growing on the ILD layer;
- performing an anneal treatment on the substrate in a furnace; and
- selectively growing the dielectric cap layer over the metal cap layer in a furnace.

2. The method of claim 1, wherein selectively depositing a dielectric cap layer further comprises treating a substrate surface in an inductively coupled plasma (ICP) chamber and subjecting the substrate to a hydrogen (H) rich environment at a temperature of about 300° C.

3. The method of claim 1, wherein performing inhibition operations comprises applying tungsten hexafluoride ($WF_6$) gas and nitrogen ($N_2$) gas to the substrate in the furnace at a temperature of about 300° C. for about 16 minutes.

4. The method of claim 3, wherein performing inhibition operations further comprises bonding fluorine (F) from the $WF_6$ to silicon (Si) on a surface of the ILD layer.

5. The method of claim 1, wherein performing an anneal treatment comprises applying $N_2$ gas to the substrate in the furnace at 400° C. for 60 minutes.

6. The method of claim 1, wherein selectively growing the dielectric cap layer comprises depositing the dielectric cap layer material by applying a thermal atomic layer deposition (ALD) process in the furnace.

7. The method of claim 6, wherein applying the ALD process comprises applying $SiH_2Cl_2$ and $NH_3$ gas to the substrate in the furnace at 400° C. resulting in SiN being deposited over the metal cap layer without growth of SiN over the ILD layer.

8. The method of claim 1, wherein performing the inhibition operations, performing the anneal treatment, and selectively growing the dielectric cap layer occur in a common furnace.

9. A fabrication method, comprising:
- forming a gate structure between an interlayer dielectric (ILD) layer on a substrate; and
- selectively depositing a dielectric cap layer comprising silicon nitride (SiN) over the gate structure by:
- treating a substrate surface to reduce oxygen (O) content in a top surface of the ILD layer;
- performing inhibition operations in a furnace to prevent SiN from growing on the ILD layer;
- performing an anneal treatment on the substrate in a furnace; and
- selectively growing the SiN over the gate structure in a furnace.

10. The method of claim 9, wherein treating the substrate surface further comprises oxidation of a surface over the gate structure.

11. The method of claim 9, wherein performing inhibition operations comprises applying tungsten hexafluoride ($WF_6$) gas and nitrogen ($N_2$) gas to the substrate in the furnace at a temperature of about 300° C. for about 16 minutes.

12. The method of claim 9, wherein selectively growing the SiN comprises depositing the dielectric cap layer by applying $SiH_2Cl_2$ and $NH_3$ gas to the substrate in the furnace at 400° C. in a thermal atomic layer deposition (ALD) process in the furnace resulting in SiN being deposited over the gate structure without growth of SiN over the ILD layer.

13. The method of claim 9, wherein the dielectric cap layer has a ratio of Si (silicon) to N (nitrogen) to O (Si:N:O) of about 1:1:1.

14. The method of claim 13, wherein the dielectric cap layer has an oxygen (O) content of between 28 to 35 percent.

15. A semiconductor device, comprising:
- a gate structure disposed between an interlayer dielectric (ILD) layer on a substrate;
- a plurality of gate spacers formed between the ILD layer and the gate structure on the substrate; and
- a silicon nitride (SiN) dielectric cap formed over the gate structure, wherein the SiN dielectric cap comprises a Si concentration of less than 40%, a nitrogen (N) concentration of less than 45%, and an oxygen (O) concentration of greater than 25%.

16. The semiconductor device of claim 15, wherein:
- the ILD layer and the gate spacers have a first height, the gate structure has a second height, and the first height is approximately equal to the second height; and
- the SiN dielectric cap is formed above the gate structure and the plurality of gate spacers, but not the ILD layer.

17. The semiconductor device of claim 15, wherein:

the ILD layer and the gate spacers have a first height, the gate structure has a second height, and the first height is greater than the second height; and the SiN dielectric cap is formed above the gate structure, but not the ILD layer or the plurality of gate spacers.

18. The semiconductor device of claim 15, wherein:

the ILD layer and the gate spacers have a first height, the gate structure has a second height, and the first height is less than the second height; and the SiN dielectric cap is formed above the gate structure and the plurality of gate spacers, but not the ILD layer.

19. The semiconductor device of claim 15, wherein the Si concentration is between 25% to 35% and the N concentration is between 25% to 40%.

20. The semiconductor device of claim 15, wherein the SiN dielectric cap has a thickness of about 5.05 nanometers or less.

* * * * *